United States Patent
Sanfilippo et al.

(10) Patent No.: US 7,602,036 B2
(45) Date of Patent: Oct. 13, 2009

(54) TRENCH TYPE SCHOTTKY RECTIFIER WITH OXIDE MASS IN TRENCH BOTTOM

(75) Inventors: Carmelo Sanfilippo, Turin (IT); Rossano Carta, Turin (IT)

(73) Assignee: International Rectifier Corporation, El Segundo, CA (US)

( * ) Notice: Subject to any disclaimer, the term of this patent is extended or adjusted under 35 U.S.C. 154(b) by 181 days.

(21) Appl. No.: 11/681,316

(22) Filed: Mar. 2, 2007

(65) Prior Publication Data

US 2007/0210401 A1    Sep. 13, 2007

Related U.S. Application Data

(60) Provisional application No. 60/779,835, filed on Mar. 7, 2006.

(51) Int. Cl.
*H01L 27/095* (2006.01)
*H01L 29/47* (2006.01)

(52) U.S. Cl. ............... 257/471; 257/476; 257/483
(58) Field of Classification Search ......... 257/471–486, 257/928, E21.359, E27.068, E29.148, E31.065, 257/E33.051
See application file for complete search history.

(56) References Cited

U.S. PATENT DOCUMENTS

2002/0066926 A1 *   6/2002   Hshieh et al. ............... 257/330

* cited by examiner

*Primary Examiner*—Hung Vu
(74) *Attorney, Agent, or Firm*—Farjami & Farjami LLP

(57) ABSTRACT

A trench type junction barrier rectifier has silicon dioxide spacers at the bottom of trenches in a silicon surface and beneath the bottom of a conductive polysilicon filler in the trench. A Schottky barrier electrode is connected to the tops of the mesas and the tops of the polysilicon fillers. Further oxide spacers may be formed in the length of the polysilicon fillers.

9 Claims, 3 Drawing Sheets

TRENCH TYPE SCHOTTKY RECTIFIER WITH OXIDE MASS IN TRENCH BOTTOM

RELATED APPLICATION

This application claims the benefit of U.S. Provisional Application No. 60/779,835, filed Mar. 7, 2006, the entire disclosure of which is incorporated by reference herein.

FIELD OF THE INVENTION

This invention relates to semiconductor devices and more specifically relates to a trench type Schottky rectifier with increased blocking voltage capability and a process for its manufacture.

BACKGROUND OF THE INVENTION

Trench Junction Barrier Schottky Rectifiers (TJBS Rectifiers) and Trench MOS Barrier Schottky (TMBS rectifiers) are well known structures capable of sustaining breakdown voltage higher than the theoretical Silicon limit in a planar structure. As will be later seen in the novel structure of the invention, the trenches are filled with doped polysilicon or other semiconductor material with an n or p doping concentration. The proposed structure also incorporates buried oxide regions into the trenches and the Schottky interface is formed at the tops of the mesas.

It would be desirable to increase the blocking voltage of such devices, or keeping the same breakdown voltage as that of a planar Schottky, but reducing the forward voltage drop by lowering the material thickness and resistivity.

With reverse bias applied, the TMBS, like the TMBS, is capable of sustaining a blocking voltage higher than Silicon's theoretical limit and is characterized by two effects: firstly, the Electric Field at the Schottky/Silicon interface is significantly reduced; secondly the Electric Field critical peak moves from the Schottky interface, down to the silicon drift region. The decreased field at the Schottky interface leads to a decrease in reverse leakage current due to the absence or reduction of the Barrier lowering effect. Further, the shift of the Electric Field peak away from the Schottky interface increases the ability of the mesa to sustain a blocking voltage greater than the theoretical blocking capability. The TJBS efficiency depends on the trench depth, the polysilicon doping concentration and the mesa width.

However, the blocking capability of the trench barrier Schottky is limited by punch-trough phenomena in the depletion layer at the transition zone between epi and substrate, that may lead to a premature breakdown voltage and limits the blocking capability of the elemental cell of the device.

BRIEF DESCRIPTION OF THE INVENTION

This invention prevents punch-through issue by combining trench Schottky effect with a trench bottom (bubble) silicon oxide effect. The Electrical Field peak distribution along the silicon (Breakdown voltage capability) may further be improved by inserting multiple oxide bubbles inside the trench.

The device combining the trench benefits and the oxide (bubble) region at the bottom of the trench region (trench Bottom Silicon Oxide PiN Merged Schottky Rectifier) successfully alters the Electric Field distribution along the trench regions, with a double triangular shape and then improves the blocking capability of the elemental cell. The presence of an oxide bubble at the trench bottom reduces the electric field peak along the trenches and mesas and prevents the punch-through phenomena.

Blocking capability may be further improved by depositing at proper distances, multiple oxide bubbles in the trench region, spaced by doped semiconductor regions (which may be p or n type polysilicon). These multiple buried bubbles produce two distinct effects: firstly, they improve the Electrical Field distribution along the trench regions; secondly they act also on mesa region leading to a better Electrical Field spread and almost absence of dangerous peaks. This Electrical Field profile is capable to support the maximum possible voltage for a given trench depth.

More specifically, and in accordance with this invention, an insulation volume or spacer is formed in the bottom of each trench and below the conductive gate. This may be done with doped polysilicon. Additional insulation spacers can also be placed along the length of the semiconductor material filling the trenches.

The introduction of the insulation spacer(s), which are preferably silicon dioxide, will alter the electric field distribution in the trench regions as well as in the Mesa regions, to improve the blocking capability of the unit cell.

Thus, the presence of the oxide spacer at the bottom of the trench region, which is then filled with a semiconductor material (for example, doped polysilicon), redistributes the electric field shape along the trench and mesas, generating a double triangular shape inside the trenches and an optimized Electrical Field distribution along the mesa region. The oxide mass reduces the electrical field peak and also prevents punch-through from the epitaxial region into the conductive silicon substrate.

It is also possible to produce additional spaced insulation masses along the length of the semiconductor filling the trenches. These will further improve the electric field distribution along the trench regions and will modify the electric field distribution along the mesa, producing a second electric field peak and thus a more uniform vertical electric field along the mesa. Thus, it's possible to support the maximum blocking voltage for a given trench depth, filler semiconductor concentration and mesa width and dielectric thickness.

Further, optimizing the trench filler semiconductor doping profile, it is possible to further decrease the electric field at the surface of the trench, improving the reliability of the elemental cell.

BRIEF DESCRIPTION OF THE PREFERRED EMBODIMENT

Figures 1, 2:
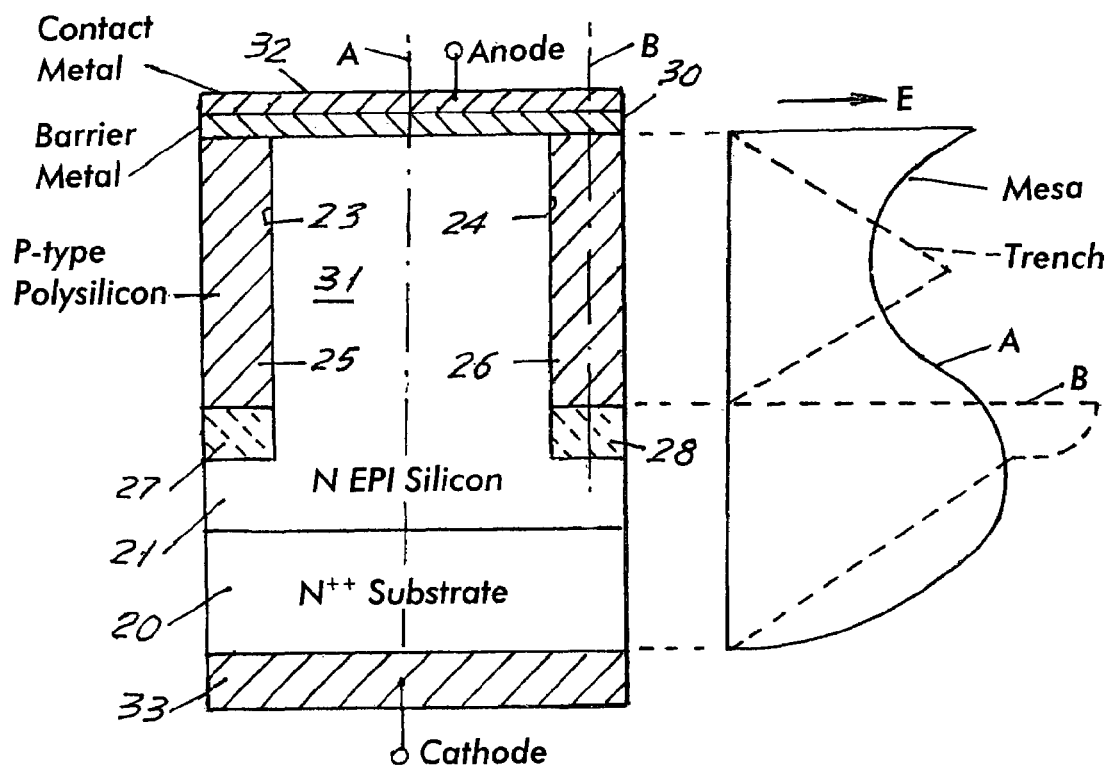
FIG. 1 is a cross-section of an elemental cell of a wafer made in accordance with the present invention.
FIG. 2 is a plot of the electric field along the length of the trench and along the mesa height in FIG. 1.

Referring first to FIG. 1, there is shown an elemental cell of a device made in accordance with the invention. It will be understood that a wafer will contain a large number of identical cells over its area. The cells may be in parallel spaced trenches or in trenches of other cross-sections such as circular, rectangular, or the like.

The cell of FIG. 1 has a high concentration ($N^{++}$) silicon substrate 20 which has a lower concentration N type epitaxial layer 21 grown on its upper surface.

A plurality of parallel grooves or trenches (shown as half grooves 23 and 24 in FIG. 1) are etched into layer 21 and are filled with doped semiconductor (for example P type polysilicon) masses 25 and 26 respectively.

In accordance with the invention, as will be later discussed, grooves 23, 24 have their bottoms filled with oxide masses 27 and 28, (or bubbles) which are below polysilicon masses 25 and 26 respectively.

A suitable Schottky barrier metal 30, which may be a metal silicide, is formed atop mesa 31 formed between pairs of grooves 23, 24 and also contacts the tops of polysilicon masses 25, 26. An anode metal 32 and cathode metal 33 are then formed on the top and bottom respectively of the cell of FIG. 1.

FIG. 2 shows the beneficial effect of the oxide masses 27, 28 on the increased device breakdown voltage. Thus, curve "A" in FIG. 2 is taken along line "A" in FIG. 1 and it is modified to reduce the higher field that would otherwise be present in the juncture between regions 20 and 21 and reduces punch-through breakdown in that region. Similarly, the electric field along the line "B" in the trenches 23, 24 is modified to the shape shown in dotted lines in FIG. 2.

Figures 3, 4:
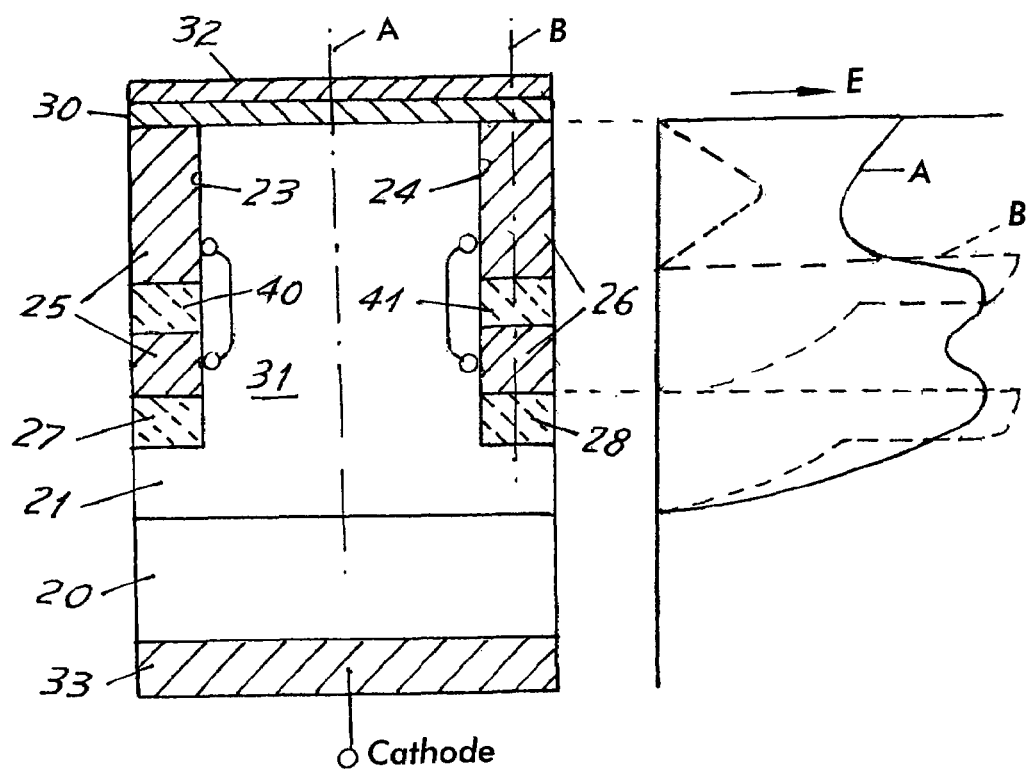
FIG. 3 is a second embodiment of the invention in which an added oxide mass is inserted into the polysilicon in the device trench.
FIG. 4 is a plot of the electric fields along the trench and along the mesa height in FIG. 3.
Figure 5:
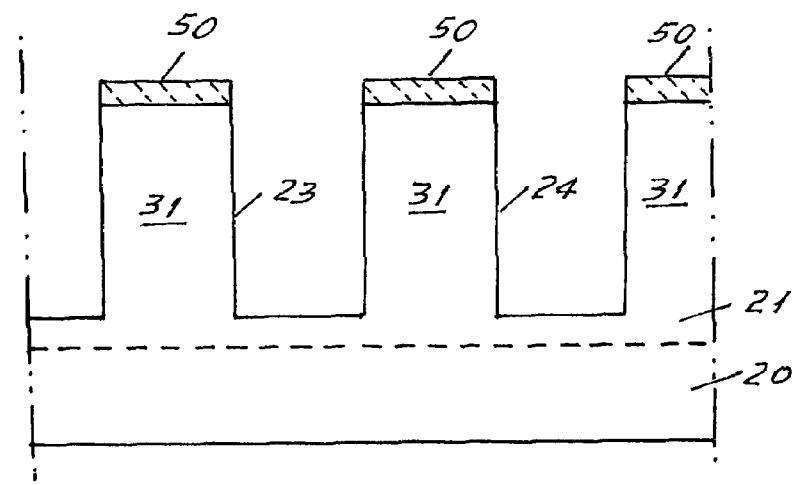
FIGS. 5 to 10 show the novel process steps used to fabricate the device (elemental cell) of FIG. 1.

FIGS. 3 and 4 show a second embodiment of the invention where numerals identical to those of FIG. 1 identify the same element. However, FIG. 3 shows added insulation masses or spacers 40, 41, which may be silicon dioxide or the like along the length of trenches 23 and 24 respectively. These further modify the electric fields along lines "A" and "B" in FIG. 3 to further improve the ability of each cell to reduce breakdown voltage.

FIGS. 5 to 10 show one possible process sequence for the manufacture of the device of FIG. 1. Thus, there is provided the wafer 20 with its epitaxial layer 21 thereon as in FIG. 1. The wafer is then provided with a $Si_3N_4$ layer 50 or another similar mask layer which is photolithographically processed to permit the etch of grooves 23 and 24 which define mesa 31 between them.

Figure 6:
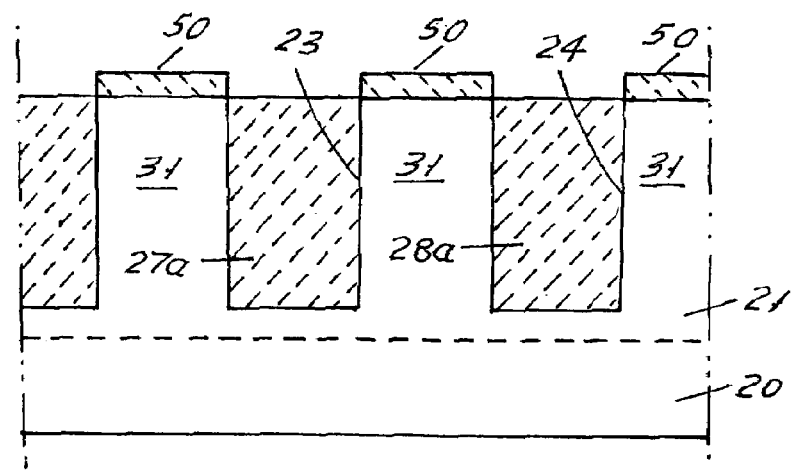

As next shown in FIG. 6, the grooves 23, 24 are filled with insulation masses, such as, silicon dioxide by any desired process such as thermal growth or deposition of oxide masses or spacers 27a, 28a.

Figure 7:
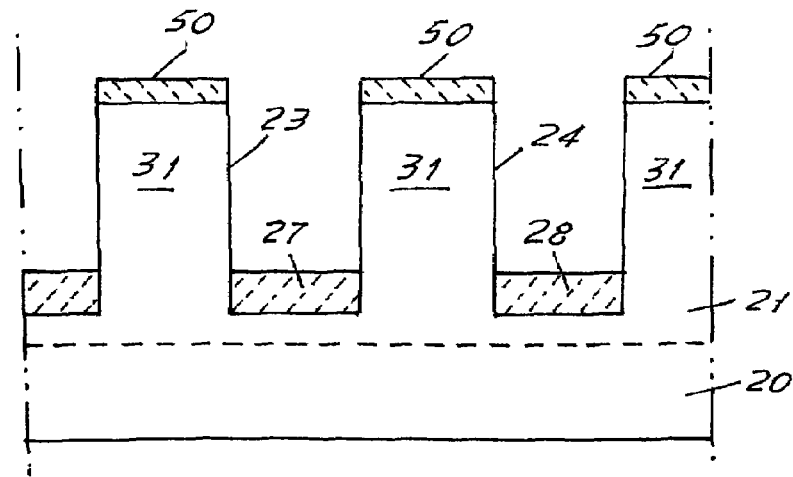

Thereafter, and as shown in FIG. 7, a silicon oxide etch is carried out, leaving the oxide masses 27, 28 in place at the trench bottoms.

Figure 8:
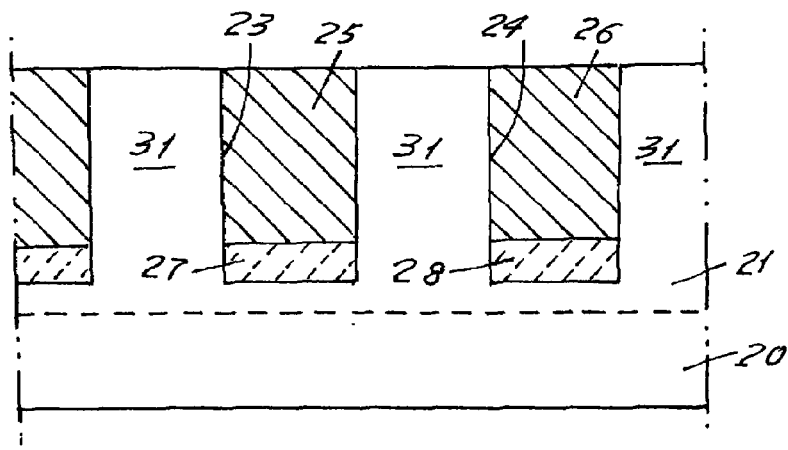

Next, as shown in FIG. 8, semiconductor masses 25, 26 are deposited into trenches 23, 24 respectively, and are properly doped and activated (the FIG. 8, shows as example polysilicon P doped).

Figure 9:
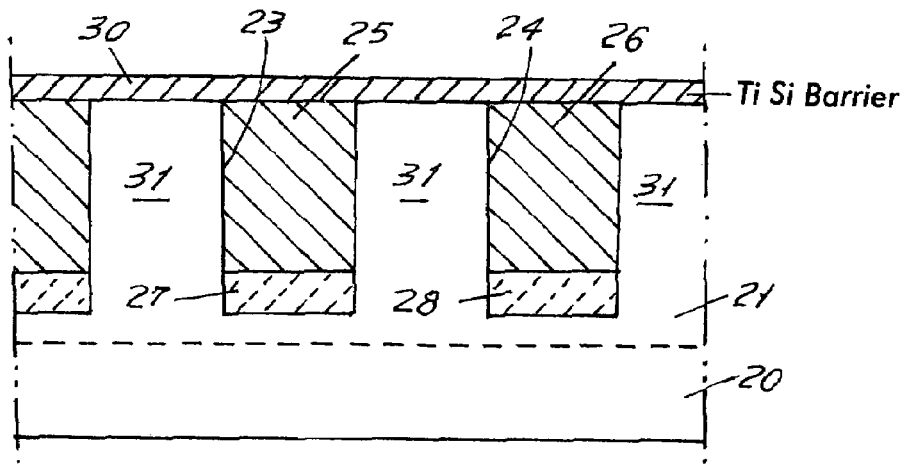
Figure 10:
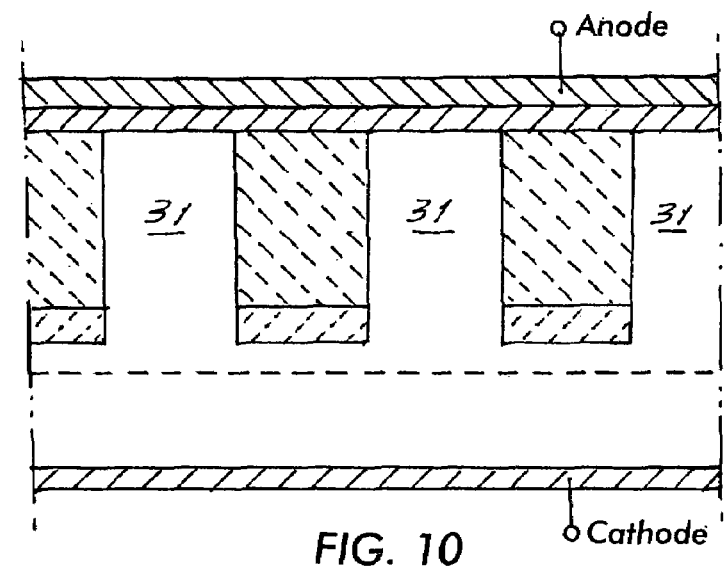

As shown in FIG. 9, a suitable Schottky barrier layer 30, for example, TiSi, is formed atop the mesa 31 and in contact with semiconductor (polisilicon) masses 25, 26, and then, in FIG. 10, top and bottom metals 32, 33 are applied.

Although the present invention has been described in relation to particular embodiments thereof, many other variations and modifications and other uses will become apparent to those skilled in the art. It is preferred, therefore, that the present invention be limited not by the specific disclosure herein.

What is claimed is:

1. A trench type Schottky barrier rectifier comprising an N type silicon wafer having a plurality of parallel openings therein, each opening including opposing sidewalls and a bottom surface, mesas between adjacent pairs of openings; a conductive polvsilicon mass of one of the conductivity types filling in and in contact with said sidewalls of each said opening; insulation masses in the bottom of said openings and beneath said polysilicon masses to reduce the electric field in said mesas; and a Schottky barrier electrode extending across the tops of said mesas and the tops of said polysilicon masses.

2. The rectifier of claim 1, wherein said silicon wafer has a high conductivity body and a top layer of epitaxial silicon of lower conductivity than that of said body; said openings being formed in said top layer.

3. The rectifier of claim 2, which further includes in each opening a second insulation mass in the body of each said polysilicon mass spaced from a respective insulation mass.

4. The rectifier of claim 3, wherein said openings are parallel spaced trenches.

5. The rectifier of claim 2, wherein said openings are parallel spaced trenches.

6. The rectifier of claim 1, which further includes in each opening a second insulation mass in the body of each said polvsilicon mass spaced from a respective insulation mass.

7. The rectifier of claim 6, wherein said openings are parallel spaced trenches.

8. The rectifier of claim 1, wherein said openings are parallel spaced trenches.

9. The rectifier of claim 1, further comprising an anode electrode over said Schottky barrier electrode.

* * * * *

UNITED STATES PATENT AND TRADEMARK OFFICE
CERTIFICATE OF CORRECTION

| | | |
|---|---|---|
| PATENT NO. | : 7,602,036 B2 | Page 1 of 1 |
| APPLICATION NO. | : 11/681316 | |
| DATED | : October 13, 2009 | |
| INVENTOR(S) | : Sanfilippo et al. | |

It is certified that error appears in the above-identified patent and that said Letters Patent is hereby corrected as shown below:

Claims, column 4, line 23, "polvsilicon" should be changed to --polysilicon--.

Claims, column 4, line 42, "polvsilicon" should be changed to --polysilicon--.

Signed and Sealed this
First Day of November, 2011

David J. Kappos
*Director of the United States Patent and Trademark Office*